(12) United States Patent  
Gerber et al.

(10) Patent No.: US 7,675,152 B2
(45) Date of Patent: Mar. 9, 2010

(54) PACKAGE-ON-PACKAGE SEMICONDUCTOR ASSEMBLY

(75) Inventors: Mark Allen Gerber, Plano, TX (US); Shawn Martin O'Conner, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/217,233

(22) Filed: Sep. 1, 2005

(65) Prior Publication Data

US 2007/0052081 A1 Mar. 8, 2007

(51) Int. Cl.
H01L 25/11 (2006.01)
(52) U.S. Cl. .................. 257/686; 257/E25.027
(58) Field of Classification Search .......... 257/686, 257/777, 778
See application file for complete search history.

(56) References Cited

U.S. PATENT DOCUMENTS

| | | | | |
|---|---|---|---|---|
| 5,565,709 A | * | 10/1996 | Fukushima et al. | 257/787 |
| 5,608,265 A | * | 3/1997 | Kitano et al. | 257/738 |
| 5,668,405 A | | 9/1997 | Yamashita | |
| 5,841,192 A | * | 11/1998 | Exposito | 257/701 |
| 5,973,393 A | | 10/1999 | Chia et al. | |
| 6,130,823 A | | 10/2000 | Lauder et al. | |
| 6,180,881 B1 | * | 1/2001 | Isaak | 174/524 |
| 6,250,606 B1 | * | 6/2001 | Juso et al. | 257/698 |
| 6,338,813 B1 | | 1/2002 | Hsu et al. | |
| 6,489,676 B2 | * | 12/2002 | Taniguchi et al. | 257/698 |
| 6,498,055 B2 | | 12/2002 | Fukyda et al. | |
| 6,503,781 B2 | * | 1/2003 | Stephenson et al. | 438/127 |
| 6,534,338 B1 | | 3/2003 | Schoonejongen et al. | |
| 6,767,767 B2 | | 7/2004 | Hayashida et al. | |
| 6,774,467 B2 | * | 8/2004 | Horiuchi et al. | 257/673 |
| 6,831,354 B2 | * | 12/2004 | Terui et al. | 257/678 |
| 7,094,676 B1 | * | 8/2006 | Leu et al. | 438/611 |
| 7,187,068 B2 | * | 3/2007 | Suh et al. | 257/685 |
| 2002/0017710 A1 | | 2/2002 | Kurashima et al. | |
| 2003/0082848 A1 | * | 5/2003 | Ohuchida | 438/106 |
| 2004/0036164 A1 | * | 2/2004 | Koike et al. | 257/723 |
| 2005/0121764 A1 | * | 6/2005 | Mallik et al. | 257/686 |

FOREIGN PATENT DOCUMENTS

JP 20017237 12/2001

* cited by examiner

*Primary Examiner*—Sue Purvis
*Assistant Examiner*—Benjamin P Sandvik
(74) *Attorney, Agent, or Firm*—Yingsheng Tung; Wade J. Brady, III; Frederick J. Telecky, Jr.

(57) ABSTRACT

Disclosed are methods and devices for providing improved semiconductor packages and POP IC assemblies using the improved packages with reduced warping. According to disclosed embodiments of the inventions, a packaged semiconductor device for use in a POP assembly includes an encapsulated region generally defined by the substrate surface. The encapsulant is provided with contact apertures permitting external communication with contacts on the substrate and coupled to an encapsulated chip. Preferred embodiments of the invention are described in which the contact aperture sidewalls are angled within the range of approximately 10-30 degrees or more from vertical and in which the contact aperture is provided a gas release channel to permit gas to escape during reflow.

13 Claims, 4 Drawing Sheets

PACKAGE-ON-PACKAGE SEMICONDUCTOR ASSEMBLY

TECHNICAL FIELD

The invention relates to semiconductor assemblies. More particularly, the invention relates to package-on-package (POP) integrated circuit (IC) assemblies and methods for manufacturing the same.

BACKGROUND OF THE INVENTION

Package-on-Package (POP) stacking of semiconductor devices is known in the arts. Stacking packages offers significant advantages primarily related to reducing device footprints. It can also be used to improve testability, for example by permitting separate testing of logic and memory packages before they are assembled in a stacked POP unit. In some instances, electrical performance may also be improved due to shortened interconnections between associated packages. Conventional POP designs are generally similar to BGA devices. A bottom package has a substrate with a top surface having a more-or-less centrally located encapsulated area containing enclosed circuitry. The encapsulated area is typically bordered by an unencapsulated periphery bearing exposed leads. A top package, configured to correspond to the bottom package leads, is affixed to the bottom package and the leads are connected using solder balls, wirebonds, or a combination thereof such that the circuitry of the top and bottom packages are operable together.

One of the challenges of POP technology lies in minimizing thickness. A particular problem for POP implementation is posed by the inherent conflict between the need to minimize thickness and the need to minimize and withstand warpage. Warpage can lead to some of the most common and debilitating problems encountered by semiconductor assemblies such as the separation of solder joints, fractures, the separation of layers, and open or short circuits caused by the separation of materials, or by the ingress of moisture between separated materials. Thin assemblies, and assemblies with layers that have differing thermal properties, e.g. POP assemblies, are particularly susceptible to warping. Warpage is generally most severe in the non-molded areas of conventional packages, i.e. the edges, and especially the corners.

Due to these and other problems, improved warp-resistant packages, POP assemblies, and methods for their manufacture would be useful and advantageous in the arts.

SUMMARY OF THE INVENTION

In carrying out the principles of the present invention, in accordance with preferred embodiments thereof, POP IC assemblies are provided with improved components and methods to increase robustness and reduce warping.

According to one aspect of the invention, a packaged semiconductor device for use in a POP assembly includes a substrate with a surface configured for accepting a semiconductor chip. The substrate surface includes a number of electrical contacts for external connection. A chip is affixed to the substrate surface and electrically coupled to the contacts. An encapsulated region defined by the substrate surface encapsulates the chip and the area including the electrical contacts, with contact apertures permitting external communication with the contacts.

According to another aspect of the invention, a package according to the invention includes contact apertures with sidewalls angled within the range of approximately 10-30 degrees from vertical. Additional aspects of the invention include greater or lesser sidewall angles.

According to yet another aspect of the invention, a POP semiconductor assembly has a first packaged device which includes a substrate with a surface for accepting a chip. The substrate surface also has electrical contacts for external connection. A chip affixed to the substrate surface and electrically coupled to the contacts is enclosed in an encapsulated region defined by the substrate surface. The encapsulated region also includes contact apertures for permitting external communication with the contacts. A second packaged device is affixed to the encapsulated region of the first package and operably coupled to the contacts such that the devices can function in concert.

According to still another aspect of the invention, a method for assembling a POP semiconductor device includes steps for providing a first packaged device with an encapsulated region approximately defined by the substrate surface and enclosing a chip and a plurality of contacts. Contact apertures are provided in the encapsulated region for external communication with the contacts. A second packaged device is operably coupled to the first packaged device to form a POP assembly.

The invention has advantages including but not limited to providing improved POP components, assembly methods, and assemblies with improved resistance to warping. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as first, second, top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

Figure 1:
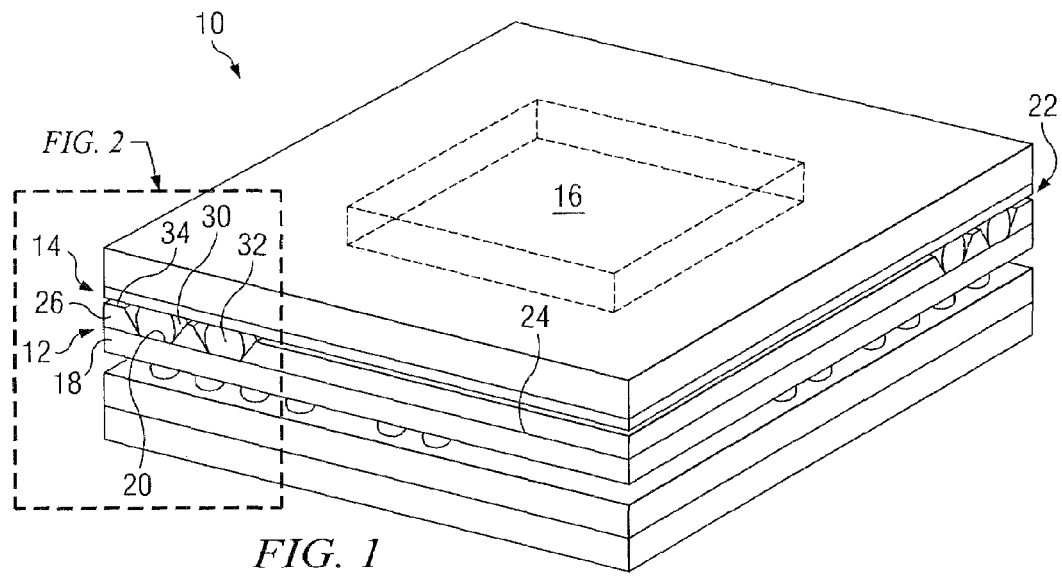
FIG. 1 is a top perspective view of an example of a POP assembly according to a preferred embodiment of the invention.
Figure 2:
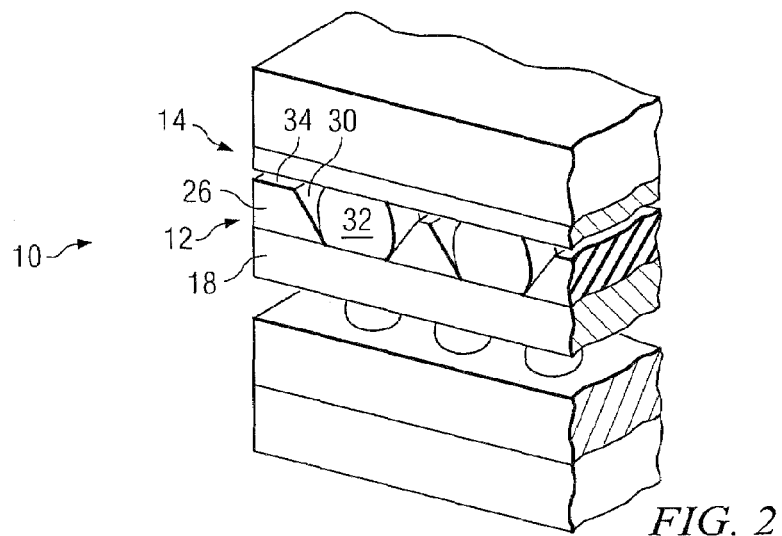
FIG. 2 is a close-up sectional view of a portion of the POP assembly shown in FIG. 1.
Figure 3:
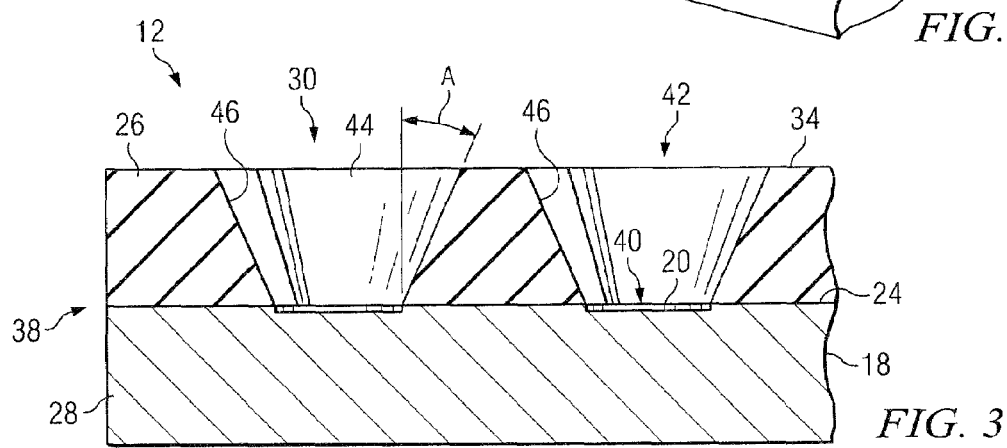
FIG. 3 is a partial sectional view of an example of a package according to the invention.

A POP assembly 10 is shown in the partial cutaway views of FIGS. 1, 2 and 3. A bottom package 12 is affixed to a top package 14 in a configuration to form a completed POP assembly 10 according to a preferred example of the invention. It should be understood that each package 12, 14, may include a chip 16 affixed to a substrate 18 having leads or pads 20 for making electrical connections as is known in the arts. It should also be understood that the terms "bottom" and "top" are used herein to describe the arrangement of the components as shown in the drawings and are not intended to delimit or restrict the spatial relationship of the components in any absolute sense, for example, the POP assembly 10 shown and described could be rotated in any direction or overturned without altering the invention. Typically, the chip 16 is more-or-less centrally located and the leads or contact pads 20 are located at or near the periphery 22 of the substrate 18 surface 24. The chip 16 is encapsulated with epoxy, silicone, or alkyd mold compound 26 as known in the arts. Preferably the encapsulant 26 extends to the edge 28 of the substrate 18, encompassing the area, e.g., the periphery 22, populated by the contacts 20. As shown, the bottom package 12 in this example has contact apertures 30 in the encapsulant 26 permitting communication with the contacts 20 at the upper surface 24 of the substrate 18. Contact apertures 30 in the encapsulant 26 facilitate the formation of electrical connections with the contacts 20, preferably using solder balls 32. The top surface 34 of the encapsulant 26 provides a uniform rigid structure above the substrate 18, continuous except for the contact apertures 30, and adapted for accepting the mounting of another package, for example "top" package 14, thereon. The top package 14 is preferably affixed to the bottom package 12 using processes and adhesives familiar in the arts. The bottom package 12 and top package 14 preferably have corresponding electrical contact pads 20 for forming electrical couplings, e.g., solder balls 32, for the purpose of enabling the packages 12, 14 to function in concert. It should be apparent to those skilled in the arts that wirebond connections, or a combination of solder balls and wirebonds, may also be used to make connections between the contacts of the packages.

With further reference primarily to FIG. 3, a portion of a bottom package 12 is shown in close-up cross-section. The contact apertures 30 provide a path to the contacts 20 at the surface 24 of the substrate 18 at the periphery 22 of the bottom package 12. Preferably, the encapsulant 26 extends to the edge of the substrate 18 forming a package edge 38 of uniform thickness. The contact apertures 30 are preferably circular in horizontal cross-section (not shown), appearing in FIG. 3 as truncated cone-shaped passageways in the encapsulant 26. Preferably, the truncated apex 40 is more-or-less defined by the area of the contact pad 20, and the base 42 terminates at the surface of the encapsulant 26. The sidewalls 44 of the contact apertures 30 are preferably angled within the range of about 10-30 degrees from vertical, indicated by angle "A" in the Figures. The exact value of angle "A" is not crucial to the practice of the invention, although angles on the order of about 10-30 degrees or greater are presently preferred for present manufacturing processes. Continuing to refer primarily to FIG. 3, preferred embodiments of the invention are also provided with a gas release channel 46. The gas release channel 46 provides a path for air and/or other gasses to escape during reflow processes. The gas release channel may be shaped and placed taking into consideration area and/or configuration requirements for the particular application.

Figure 4A:
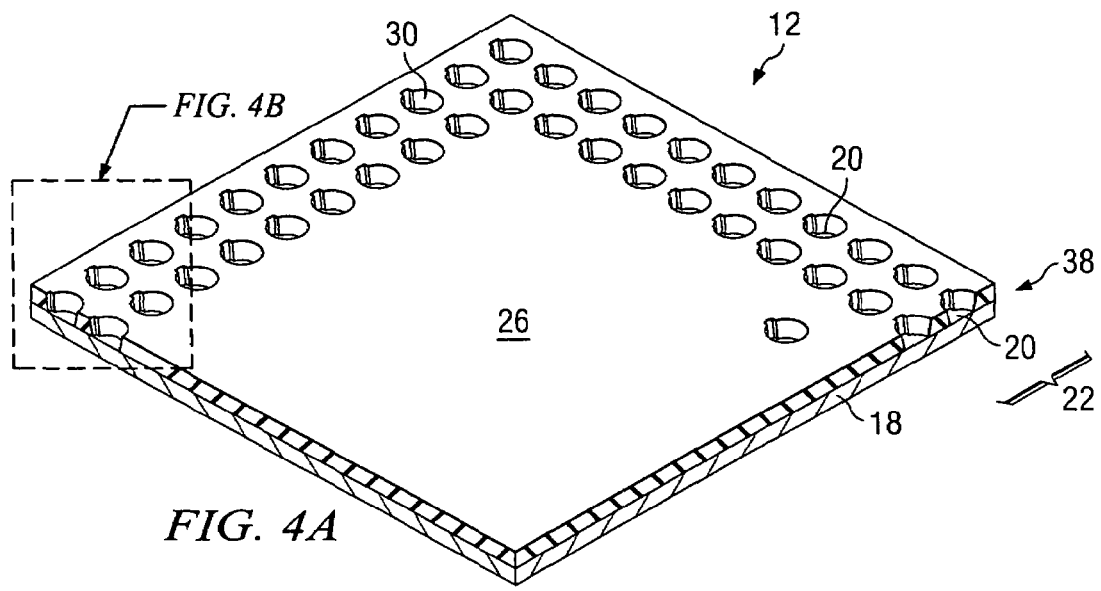
FIG. 4A is a partial top perspective sectional view of another example of a package according to the invention.
Figure 4B:
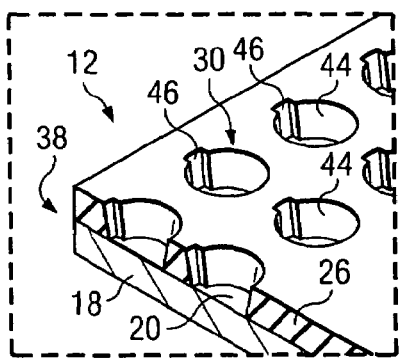
FIG. 4B is a partial close-up view a portion of the package shown in FIG. 4A.
Figure 5A:
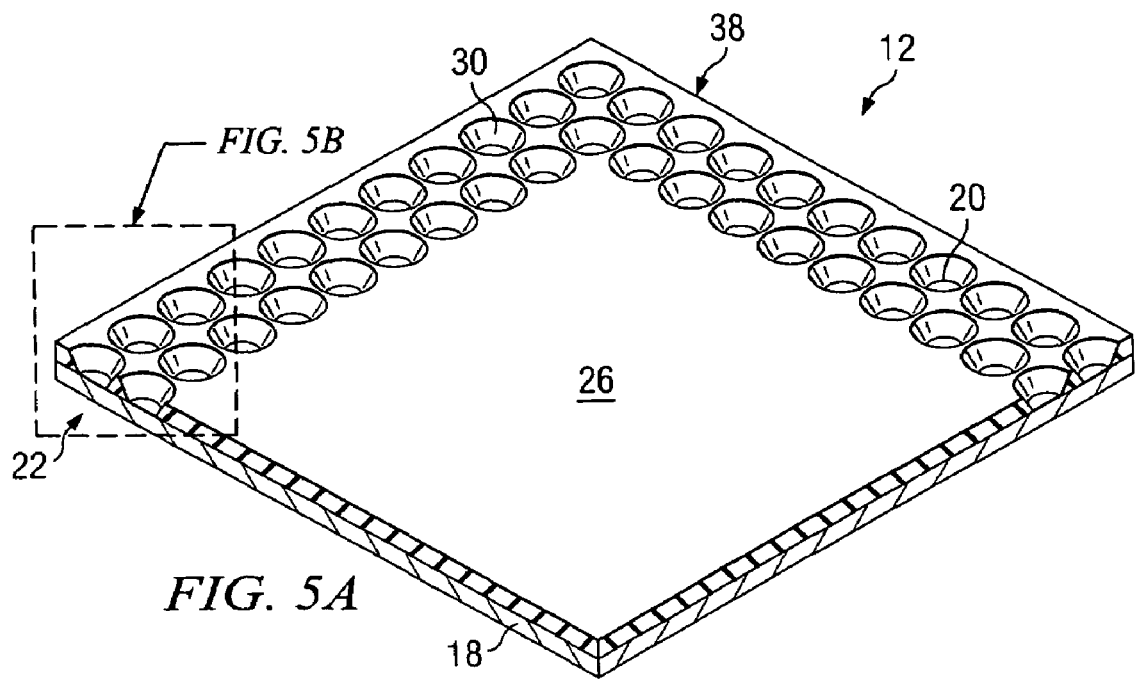
FIG. 5A is a partial top perspective sectional view of still another example of a package according to the invention.
Figure 5B:
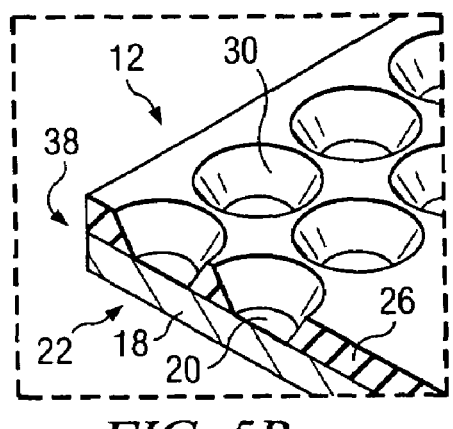
FIG. 5B is a partial close-up view a portion of the package shown in FIG. 5A.

Further examples of bottom packages 12 according to the invention are shown in FIGS. 4A through 5B. FIG. 4A, and corresponding close-up FIG. 4B, show an example of a package with a contact aperture angle A of 10 degrees. FIGS. 5A-5B show an example with a contact aperture angle A of 30 degrees. It should be appreciated from the examination of the figures that a larger angle A, as in FIGS. 5A-5B, may be used to accommodate larger solder balls. A smaller angle A as shown in the example of FIGS. 4A-4B may be used with higher contact pad 20 densities, or may be used to provide increased encapsulant area between contact apertures 30, providing the package 12 with increased rigidity. These examples are representative of preferred embodiments of the invention. There are many possible variations in the configuration of the bottom package 12, and therefore of the POP assembly 10, without departure from the principles of the invention, including sidewalls with longer slopes.

Figure 6A:
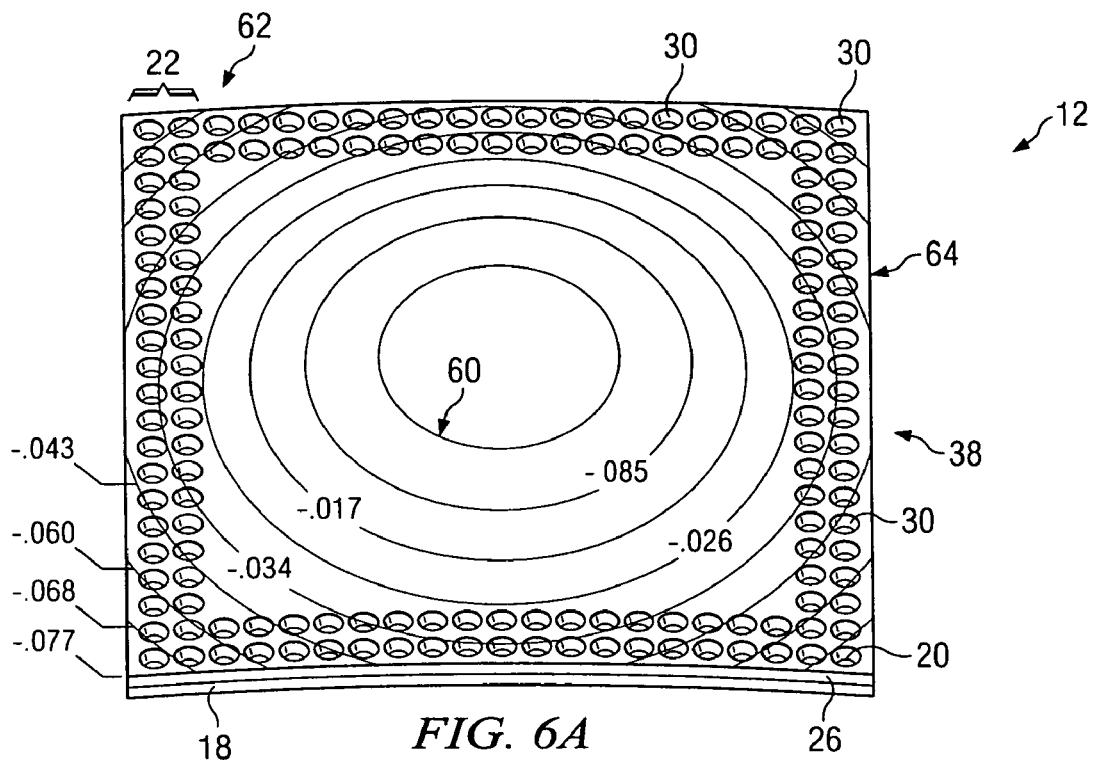
FIG. 6A is a graphical representation showing resistance to warpage in a POP assembly of a preferred embodiment of the invention.
Figure 6B:
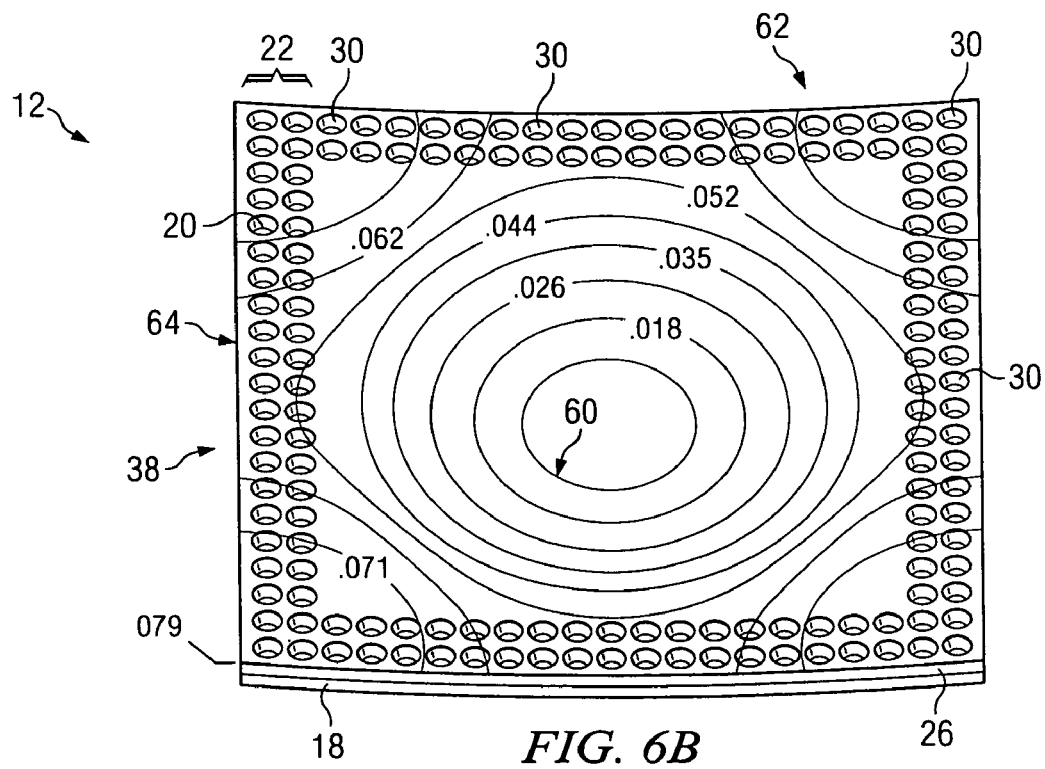
FIG. 6B is another graphical representation showing resistance to warpage in a POP assembly of a preferred embodiment of the invention.

Attention to FIGS. 6A and 6B may enhance understanding of the principles and advantages of the inventions. FIG. 6A is a graphical representation of an example of a preferred embodiment of a bottom package 12 according to the invention experiencing "sad" (corners downward) flexion forces during testing exposure to room temperature, i.e., 25 degrees C. Contour lines 60 represent mechanical stress exerted on the package 12 with warpage measured in micrometers. It can be seen that the stresses, and therefore the potential for warpage, tends to be greatest at the corners 62 and edges 64, in this example, the maximum flexion is about −78 um. FIG. 6B shows a graphical representation of a bottom package 12 of the invention subjected to a peak temperature of about 260 degrees C. such as might be encountered during manufacturing processes known in the arts. Examination of the contour lines 60 of FIG. 6B reveals a maximum deflection in the "happy" (corners upward) direction of about 79 um. In the case of the representative temperatures illustrated in FIGS. 6A and 6B, it can be seen that the warpage of the package 12 is considerably less than might be typically encountered in the arts.

Those reasonably skilled in the arts will recognize that various alternatives exist for the adaptation of the methods of the invention to specific applications. For example, the more uniform encapsulation of the invention causes the top and bottom packages to be very similar in terms of their responses to changes in temperature. The resulting combination is therefore resistant to warpage. The methods and devices of the invention provide one or more advantages, including but not limited to resistance to warpage, improved reliability, and improved testability. While the invention has been described with reference to certain illustrative embodiments, those described herein are not intended to be construed in a limiting sense. It will be appreciated by those skilled in the arts that the invention may be used with various types of semiconductor device packages. Various modifications and combinations of the illustrative embodiments as well as other advantages and embodiments of the invention will be apparent to persons skilled in the arts upon reference to the drawings, description, and claims.

We claim:

1. A PoP (package on package) semiconductor device, comprising:

a first package including:

an insulating substrate with edges, having electrical contact pads affixed on a first surface surrounding a semiconductor chip and a second surface opposite the first surface;

an encapsulant material on the first surface of the substrate extending toward the edges of the substrate beyond the contact pads;

apertures having truncated cone shape with circular cross section through the encapsulant extending to the contact pads; and the second surface free of the encapsulant material; and a second package comprising second electrical contact pads directly affixed to corresponding electrical contact pads of the first package by a solder ball at the apertures.

2. The semiconductor device of claim 1, in which the encapsulant material meets the edges of the substrate.

3. The semiconductor device of claim 1, in which the first package is a BGA package.

4. The semiconductor device of claim 3, in which the second package is a BGA package.

5. The semiconductor device of claim 1, in which the encapsulation material on the first surface has a uniform thickness except at the a apertures.

6. The semiconductor device of claim 1, in which the first package warps at room temperature.

7. The semiconductor device of claim 6, in which the warpage is less than 100 µm.

8. The semiconductor device of claim 7, in which the warpage represents the deviation of the package from being planar.

9. The semiconductor device of claim 8, in which the warpage is less than 80 µm.

10. The semiconductor device of claim 1, in which the first package warps at an elevated temperature.

11. The semiconductor device of claim 10, in which the warpage represents the deviation of the package from being planar.

12. The semiconductor device of claim 11, in which the warpage is less than 100 µm at about 260° C.

13. The semiconductor device of claim 12, in which the warpage is less than 80 µm at about 260° C.

* * * * *